(12) United States Patent
Aubry et al.

(10) Patent No.: US 10,135,239 B2
(45) Date of Patent: Nov. 20, 2018

(54) INTEGRATED CIRCUIT CHIP PROTECTION AGAINST PHYSICAL AND/OR ELECTRICAL ALTERATIONS

(71) Applicant: NAGRAVISION S.A., Cheseaux-sur-Lausanne (CH)

(72) Inventors: Pascal Aubry, Cormondreche (CH); Stephane Jullian, Gex (FR)

(73) Assignee: NAGRAVISION S.A., Cheseaux-sur-Lausanne (CH)

( * ) Notice: Subject to any disclaimer, the term of this patent is extended or adjusted under 35 U.S.C. 154(b) by 0 days.

(21) Appl. No.: 15/573,615

(22) PCT Filed: May 13, 2016

(86) PCT No.: PCT/EP2016/060910
§ 371 (c)(1),
(2) Date: Nov. 13, 2017

(87) PCT Pub. No.: WO2016/180977
PCT Pub. Date: Nov. 17, 2016

(65) Prior Publication Data
US 2018/0102643 A1    Apr. 12, 2018

(30) Foreign Application Priority Data
May 13, 2015   (EP) .................................... 15167588

(51) Int. Cl.
*H02H 9/04*      (2006.01)
*H01L 27/02*     (2006.01)
(Continued)

(52) U.S. Cl.
CPC ........... *H02H 9/046* (2013.01); *H01L 25/065* (2013.01); *H01L 27/0248* (2013.01); *H05F 3/02* (2013.01)

(58) Field of Classification Search
USPC ........................................................ 174/261
See application file for complete search history.

(56) References Cited

U.S. PATENT DOCUMENTS 5,483,421 A * 1/1996 Gedney ................. H01L 23/145
174/255
8,881,087 B2 * 11/2014 Herder ................. H01L 23/5223
716/126
(Continued)

OTHER PUBLICATIONS

International Search Report Issued in International Application No. PCT/EP2016/060910 dated Aug. 5, 2016.
(Continued)

*Primary Examiner* — William H Mayo, III
*Assistant Examiner* — Krystal Robinson
(74) *Attorney, Agent, or Firm* — DLA Piper LLP US

(57) ABSTRACT

An integrated circuit chip and a method for protecting the integrated circuit chip against physical and/or electrical alterations are disclosed. The chip comprises at least one semiconductor layer including semiconductor components and conductive tracks, at least one layer formed by a first type of conductive tracks extending over all or part of a surface of the chip and at least one second type of conductive track connected to at least one detection circuit configured to detect an alteration of the at least one second type of conductive track. The chip is characterized in that the at least one first type of conductive track is mixed within the at least one second type of conductive track, the material and the layout of at least one second type of conductive track being indiscernible, by an observation device, from the material and the layout of the at least one first type of conductive track.

17 Claims, 2 Drawing Sheets

(51) Int. Cl.
*H01L 25/065* (2006.01)
*H05F 3/02* (2006.01)

(56) References Cited

U.S. PATENT DOCUMENTS

| | | |
|---|---|---|
| 2008/0313746 A1 | 12/2008 | Doi |
| 2009/0019411 A1* | 1/2009 | Chandra ............. G06F 17/5009 716/119 |
| 2011/0001249 A1* | 1/2011 | Law ..................... H01L 23/481 257/776 |

OTHER PUBLICATIONS

Written Opinion Issued in International Application No. PCT/EP2016/060910 dated Aug. 5, 2016.

* cited by examiner

INTEGRATED CIRCUIT CHIP PROTECTION AGAINST PHYSICAL AND/OR ELECTRICAL ALTERATIONS

CROSS REFERENCE TO RELATED APPLICATIONS

This application is a U.S. National Stage Application of International Application No. PCT/EP2016/060910 filed May 13, 2016, which claims priority from European Patent Application No. 15167588.1 filed May 13, 2015. The entireties of all the above-listed applications are incorporated herein by reference.

FIELD OF THE INVENTION

The present invention relates to semiconductor integrated circuit chips as used for smartcards or security modules or systems on chip. In particular, an integrated circuit chip protected against physical and/or electrical alterations and a method to protect any chip are disclosed.

TECHNICAL BACKGROUND

Integrated circuit chips are often subjected to physical attacks, such as live hardware analysis, aimed at gaining knowledge of the internal functioning of the chip and consequently influencing the operation of the chip. During such an attack, the plastic housing protecting the chip against mechanical damage may be opened on its top face to reveal a passivation layer covering the electronic circuitry. The passivation layer may be selectively removed by etching methods using laser, or Focused Ion Beam (FIB) technology, or using chemical means to allow access to the signal lines. Live hardware analysis techniques may be performed on integrated circuit chips during their operation, whereas other techniques such as reverse engineering, which is aimed at analyzing and reconstructing the operation of the chip, usually result in the destruction of the chip.

An analysis of the integrated circuit chip is usually undesirable. Live hardware analysis should be prevented, if possible, particularly in the case of secure circuits such as a microprocessor on a smart card including an electronic wallet function or the like. In practice, various methods already exist to render such an analysis more difficult. In general, an integrated circuit chip is formed by a plurality of stacked layers of semiconductor components and tracks. Each layer may include metallic planes or a plurality of tracks mainly for powering, which may also act as a physical shield. The top surface of the chip is in general covered by a passivation layer used for redundant power distribution and/or for providing physical shielding. An attacker may create openings in one or more of these layers for injecting faults in the circuits or capturing signals for analysis.

Physical attacks of all or parts of the chip may be prevented by so-called passive shields, such as metallic planes or tracks connected to a circuit configured to perform analogue integrity measurements in order to detect cuts, short circuits or capacitive load variations for example. The passive shield may be defeated by deviating tracks in an outside circuit or because of ineffective preset tolerance thresholds in the case of capacitive loads measurements.

Therefore, an active shield may be preferred. It may consist of a plurality of tracks arranged on the top of the chip in which random bit sequences are injected and checked for conformity from one end of a track to another. This active shield may be defeated by methods using a Focused Ion Beam (FIB) apparatus if the functions of the tracks are known and if their geometrical arrangement may be modified without altering the signals carried by the concerned tracks.

Document US2008/313746A1 discloses a protection circuit for integrity monitoring of an electronic device. The protection circuit includes: a first grid check line interleaved between a first set of conductor lines, each distributing a first potential reference to the electronic device, a second grid check line interleaved between a second set of conductor lines, each distributing a second potential reference to the electronic device, and a grid check circuit coupled to the first and second grid check lines. The first and second grid check lines are configured to provide first and second voltage references, respectively, to the grid check circuit for monitoring the integrity of the electronic device. According to an exemplary embodiment, the top two layers of metal of an integrated circuit are utilized. Most high performance submicron processes utilize 7-8 layers of metal and the top two layers are typically used for power distribution, clock distribution and assembly. A grid check line that runs parallel in each layer to the power grid is mixed within the top two layers of metal. The grid check lines are configured to be stimulated and sensed by grid check circuits located at various places around the die, preferably shielded by overlaying metal layers. The grid check circuits are configured to both stimulate the grid check lines as well as sense them. This allows the grid to be verified from multiple locations around the die with an active send/receive capability.

SUMMARY OF THE INVENTION

According to one embodiment, a chip according to claim 1 is provided as well as a method according to claim 9 for protecting a chip against alterations such as physical and/or electrical alterations.

The chip comprises at least one semiconductor layer including semiconductor components and conductive tracks. The chip further comprises at least one layer formed by a first type of conductive tracks extending over all or part of a surface of the chip and at least one second type of conductive track associated with at least one detection circuit configured to detect an alteration of the at least one second type of conductive track. The at least one first type of conductive track and the at least one second type of conductive track being made of a material including metal or alloy presenting a high electrical conductivity may be arranged according to a predefined layout on the at least one layer. The at least one first type of conductive track is mixed within the at least one second type of conductive track, the material and the layout of at least one second type of conductive track being indiscernible, by an observation device, from the material and the layout of the at least one first type of conductive track.

The observation device may include an electronic microscope configured to visually observe material and layout of tracks, or any other analyzer capable of determining nature, structure, and/or composition of material, arrangement or pattern formed by tracks on the chip.

The method for protecting a chip against alterations comprises forming at least one second type of conductive track in a predefined material and arranging the at least one second type of conductive track according to a predefined layout, mixing the at least one second type of conductive track within the first type of conductive tracks, connecting the at least one second type of conductive track to at least one detection circuit configured to detect an alteration of the at least one second type of conductive track. The material and the layout of the at least one second type of conductive track are selected to be indiscernible from the material and the layout of the at least one first type of conductive track by the observation device.

In a preferred embodiment, the at least one second type of conductive track is arranged to be mixed among first type of conductive tracks covering the top layer of the integrated circuit chip. This first type of conductive tracks forms a passive shield, also called passive shielding layer, playing a role of shielding the chip against external electromagnetic perturbations as well as electromagnetic radiation produced by the chip activity. In addition to the shielding effect, the passive shield, comprising a plurality of conductive tracks, may have a function of distributing power or ground to different parts of the integrated circuit chip. The first type of conductive tracks of the passive shield may be placed in a grid configuration, which is usually referred as "power grid".

The chip of the invention comprises at least one second type of conductive track mixed within the first type of conductive tracks forming the power grid.

Thanks to a material similar to the material of the tracks of the power grid and a layout similar to the layout of the tracks of the power grid, the second type of conductive track cannot be distinguished by visual observation from the first type of conductive tracks forming the power grid.

In general, the chip comprises more than one conductive track of the second type, which may additionally form an active shield combined with the tracks of the power grid.

Regarding the material, the term "indiscernible" means at least indistinguishable from a visual point of view, i.e. an observation made through an optical or electronic microscope does not allow seeing any difference between the material of the first and second type of conductive tracks. According to one embodiment, the material used for manufacturing the conductive tracks of the first type corresponds or is identical to the material used for manufacturing the conductive tracks of the second type.

Regarding the layout, the term "indiscernible" means a layout of the second type of conductive tracks comparable to the layout of the first type of conductive tracks, i.e. an observation made through an optical or electronic microscope does not allow distinguishing first and second type of conductive tracks by their layout or pattern formed by the tracks. In other words, the layout of the second type of conductive tracks may be an imitation of the layout of the first type of conductive tracks. The pattern formed by the second type of tracks may be a reproduction of the pattern formed by the first type of tracks even the second and first type of tracks are linked to different components or other tracks inside the chip.

A layout is to be understood as a geometrical substantially planar arrangement of the tracks, having given dimensions, on an internal or top layer of the chip. For example, the tracks having a predetermined width may be arranged to form continuous strait or curved lines or segmented lines formed by a combination of strait and/or curved line portions.

The tracks of the second type forming the active shield are associated with a detection circuit configured to enable countermeasures in case of physical and/or electrical alteration such as cutting one or more tracks forming the active shield. The active shield tracks may carry variable electrical signals while the passive shield tracks may be at a constant potential such as for example Vdd=5 Volt power supply or ground Vss=0 Volt in CMOS technology.

According to an embodiment of the invention, the active shield tracks may be at a constant positive or negative potential and carry superimposed variable signals as well.

BRIEF DESCRIPTION OF THE DRAWINGS

The present invention will be better understood thanks to the detailed description, which follows, and the accompanying drawings, which are given as non-limiting examples of embodiments of the invention, namely.

DETAILED DESCRIPTION OF THE INVENTION

Figure 1:
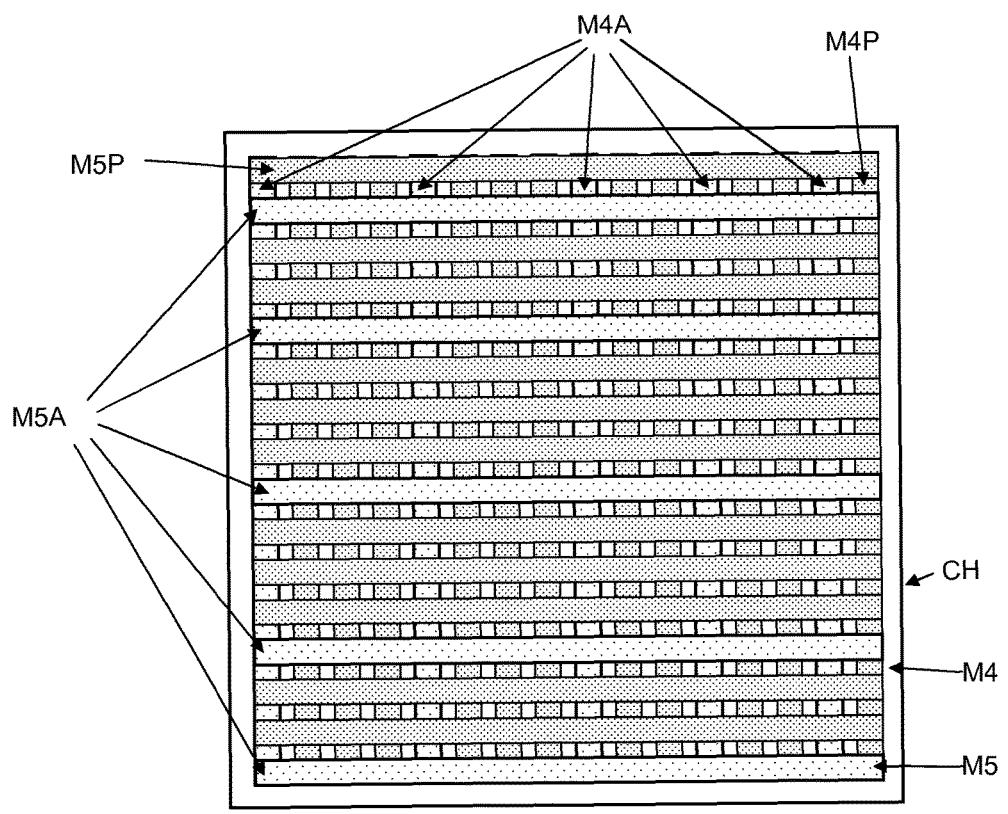
FIG. 1 showing a top view of two superimposed layers of conductive tracks completely covering the top surface of a chip, each layer comprising tracks of an active shield mixed within tracks of a power grid.

In security critical integrated circuit chips, some security countermeasures are implemented to provide safety of the critical information against reverse engineering techniques or physical and/or electrical alterations including analysis of the circuit hardware during operating. Some of these alterations aimed at obtaining the information in an unauthorized way are known as live physical attacks since they require physical access to the inner layers of the integrated circuit chip. These attack techniques include probing the critical information by making connections to the conductive tracks of the integrated circuit chip, faulting the integrated circuit chip by forcing electrical signals from these outside connections and changing the connections of the internal conductive tracks permanently by using Focused Ion Beam (FIB) or by using Fault attacks such as laser attacks.

According to an exemplary configuration, a shield comprising a plurality of metal tracks may cover the whole surface of the integrated circuit chip by forming a top metal layer. All or part of these metal tracks may be supplied with a predefined or random analog or digital test signal produced by at least one transmitter of at least one detection circuit and observed with at least one associated receiver located at certain points of the integrated circuit. The receiver is also supplied internally with a reference test signal similar to the test signal on the metal tracks. The receiver verifies the integrity of the top layer metal tracks by comparing the test signal with the reference test signal and enables countermeasures if a result of the comparison shows a difference between the reference test signal and the test signal produced by the transmitter.

Since any physical and/or electrical attack will disturb the integrity of these metal tracks by making them open or short circuit, the receiver does not receive the correct test signal pattern from the tracks, thus detects the physical and/or electrical attack.

A shield rendered active by supplying a test signal used to detect any physical and/or electrical attack is still vulnerable to physical modification. Since the top layer metal tracks of the active shield have fixed interconnections, it is possible to make shortcut connections between the tracks and remove the parts covering the whole integrated circuit chip or a part of it, to perform the actual attack without being detected by the detection circuits associated to the active shield tracks.

To overcome this problem, an efficient and low cost solution consists in fact of a so-called obfuscation of the active shield tracks among passive shield tracks of a power grid for example. In this way, active shield tracks cannot be differentiated from passive shield tracks, in particular when both kinds of tracks are arranged according to a similar layout forming a given pattern or are arranged according to at least similar enough layouts to be indistinguishable from each other.

The active shield tracks, i.e. the second type of conductive tracks may be made of a material identical to the material of the passive shield tracks, i.e. the first type of conductive tracks. For example, both types of tracks may be made of material such as for example, gold, silver, copper, aluminum, or any other metal or alloy presenting a high electrical conductivity. The material of the active shield tracks is thus visually undistinguishable or indiscernible, by an observation device, from the material of the passive shield tracks.

According to an embodiment, the first type and the second type of tracks may look the same but they each may be composed by different alloys of gold, silver, copper, aluminum, etc. in condition to be visually indistinguishable from each other.

The protection circuit disclosed by document US2008/313746A1 does not include the feature regarding material and layout resemblance of grid check lines, (active shield tracks) and unchecked power grid lines (passive shield tracks). In this case, if the checked and unchecked lines (the active and passive shield tracks) can be differentiated, it may possible to make shortcut connections between the checked lines for performing a physical attack without being detected by the detection circuits associated to the checked lines.

The power grid represented schematically by FIG. 1 may cover the entire top surface of the chip that is substantially planar, or according to an embodiment, the power grid may extend only on one or more selected zones thereof where an enhanced protection is required for security purposes. The conductive tracks, i.e. metal tracks, forming the power grid may be arranged in any way on the top surface depending on the structure and contacts arrangements of the semiconductor components integrated in the chip.

The power grid of FIG. 1 is made up of a layer M4 including a row of parallel tracks distributed on the entire top surface of the chip CH. The row comprises standard power grid tracks M4P and active shield tracks M4A that are mixed within the power grid tracks. Furthermore, the power grid may be completed by an additional layer M5 including a row of parallel tracks where each track is perpendicular to the tracks of the lower layer M4 to form a grid having a given track density. As in the lower layer M4, the row comprises standard power grid tracks M5P and active shield tracks M5A.

The active shield tracks M4A, M5A, which are independent from the power grid tracks M4P, M5P are connected to one or more detection circuits configured to monitor physical integrity of these tracks. For example, each active shield track or groups of them may be monitored by a specific detection circuit or all active shield tracks may be monitored by a same detection circuit.

The power grids placed at different levels power the chip in a redundant way so that when one or more tracks are cut, the chip remains powered. The detection circuits, connected only to the active shield tracks, may measure variations of electrical signals, potential or current as well as cuts of these active shield tracks occurring at physical and/or electrical attacks on the chip and may enable countermeasures such as resetting or disabling all or part of the chip's functionalities.

The grid arrangement of the tracks shows advantageous since the probability to cut an active shield track increases with the density of the grid, i.e. with the number of tracks per millimeter in each direction and the number of active shield tracks arranged within the passive shield tracks.

According to a preferred embodiment, the active shield tracks are supplied with a similar potential, i.e. a substantially equal potential as the one of the power grid tracks in order to improve obfuscation in relation to the power grid tracks.

Electrical measurements by probing or imaging by using tools such as Scanning Electron Microscopy to observe voltage contrast or FIB Focused Ion Beam, will thus give a similar result than same measurements on the power grid tracks. In these conditions, an attacker may not recognize an active shield track from conventional power grid tracks so that bypassing the layers M4, M5 becomes very difficult without being detected.

Figure 2:
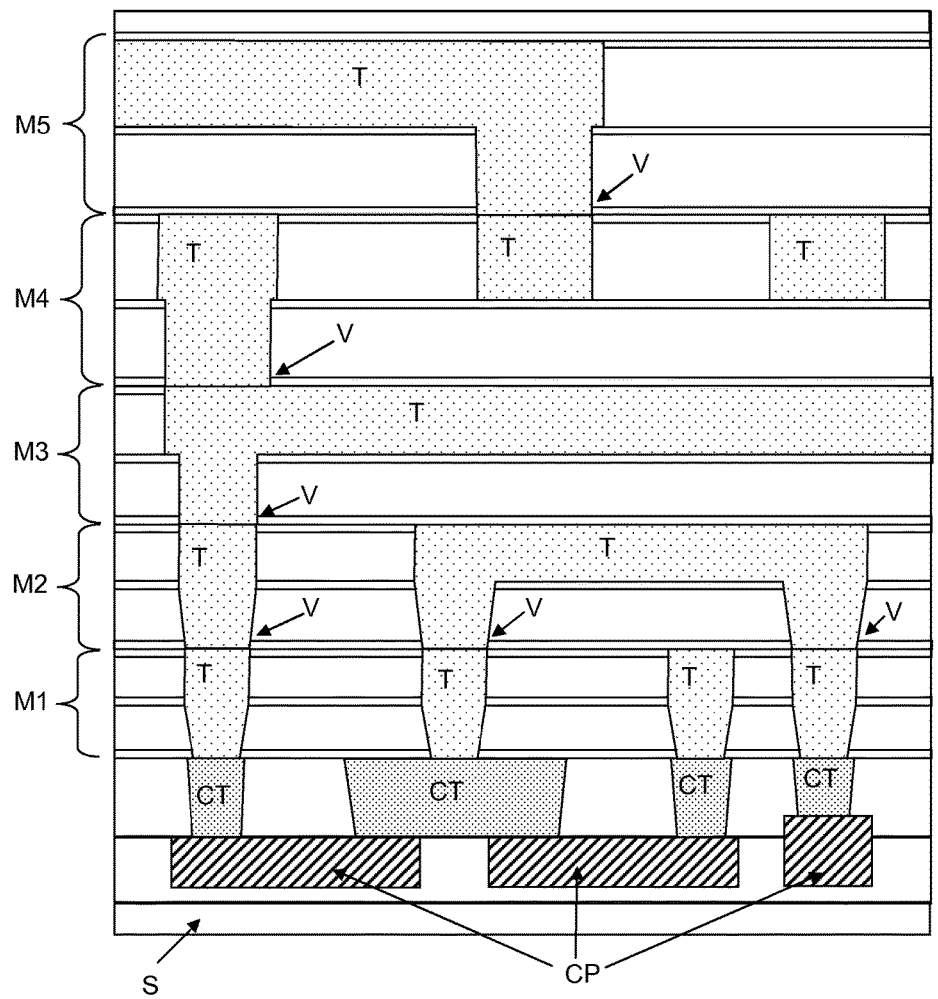
FIG. 2 showing a sectional view of an integrated circuit chip provided with the protection according to the invention.

For example, in a configuration represented by the sectional view of FIG. 2, the chip comprises a substrate S supporting semiconductor components CP, a surface including contacts CT covered by a stack of 5 successive layers M1, M2, M3, M4, M5 each separated by an insulating layer made up for example of silicon oxide, nitride or carbide.

Each layer M1, M2, M3, M4 M5 includes conductive tracks T extending on all or part of the chip surface. The conductive tracks T thus distributed in one or more layers M1, M2, M3, M4, M5, may further be connected each other and/or to the contacts CT of the components or circuits such as detection circuits arranged at the bottom of the stack by traversing the layers thanks to vias V.

Each layer M1, M2, M3, M4, M5 may comprise conductive tracks T supplied by a different potential or signal or, in certain cases, a same potential or signal may be applied to tracks of two or more layers depending of the integrated circuit chip configuration.

Some tracks T comprised in these layers M1, M2, M3, M4, M5 may constitute an active shield monitored by one or more detection circuits preferably integrated in the chip CH near other circuits. The active shield thus protects all or only the critical parts of the chip as well as the detection circuit themselves thereby preventing any direct tampering by disabling these detection circuits.

If detection circuits could be neutralized by an attacker, the active shield may be cut or removed without enabling the countermeasures foreseen in case of physical alteration thereof. To solve this problem, the chip comprises a set of detection circuits comprising fake and real detection circuits. The additional fake circuits or cells have an identical or almost identical layout to the real detection circuits, which may also be positioned at different places on the chip in order to obfuscate localization of the real detection circuits. Preferably, the fake detection circuits may be arranged according to a layout indiscernible, by an observation device, from the layout of the real detection circuit. The fake detection circuits may be an imitation of the real detection circuits.

The active shield tracks and their associated detection circuits may be implemented in a chip in an efficient way at reduced cost during manufacturing of the chip because it uses existing metallic layers also used as shields and/or power grids. The active shield tracks do not only have to be inserted in the top layer, but may also be inserted in the different intermediate semiconductor layers of the chip.

The invention claimed is:

1. A chip comprising at least one semiconductor layer including semiconductor components and conductive tracks, said chip comprising:

at least one layer formed by a first type of conductive track portion extending over all or part of a surface of the chip; and at least one second type of conductive track portion associated with at least one detection circuit configured to detect an alteration of the at least one second type of conductive track portion;

wherein the at least one first type of conductive track portion and the at least one second type of conductive track portion being made of a material including metal or alloy presenting a high electrical conductivity are arranged according to a predefined layout on the at least one layer, the at least one first type of conductive track portion being mixed within the at least one second type of conductive track portion, the material and the layout of at least one second type of conductive track portion being visually indiscernible from the material and the layout of the at least one first type of conductive track portion.

2. The chip according to claim 1, wherein the at least one second type of conductive track portion is made of a material identical to the material of the first type of conductive track portion.

3. The chip according to claim 1, wherein the one detection circuit is configured to enable the application of at least one countermeasures in response to detecting a physical or electrical alteration of the at least one second type of conductive track portion.

4. The chip according to claim 3, wherein the at least one second type of conductive track portion is configured to be supplied with a potential substantially equal to the potential of the first type of conductive track portion.

5. The chip according to claim 3, wherein the at least one countermeasure is one of resetting or disabling all or part of the functionality of the chip.

6. The chip according to claim 5, wherein the at least one second type of conductive track portion is located within the first type of conductive track portion so as to shield against external electromagnetic perturbations or electromagnetic radiation produced by the chip activity.

7. The chip according to claim 1, wherein the at least one second type of conductive track portion is located within the first type of conductive track portion forming a substantially planar power grid covering a top surface of the chip, configured to supply the first type of conductive track portion with a predetermined potential.

8. The chip according claim 1, wherein the at least one detection circuit comprises at least one transmitter configured to produce a test signal applied to the at least one second type of conductive track portion and at least one receiver associated with the transmitter configured to verify integrity of the second type of conductive track portion by comparing the test signal with a reference test signal and to enable the at least one countermeasures if a result of the comparison shows a difference between the reference test signal and the test signal produced by the transmitter.

9. The chip according claim 1 further comprising a set of fake and real detection circuits positioned at different places on the chip, the fake detection circuits being arranged according to a visibly indiscernible layout from the layout of the real detection circuit.

10. A chip prepared by a process comprising:

forming a layer on the chip having a first type of conductive track portion extending over all or part of a surface of the chip;

forming at least one second type of conductive track portion of a predefined material and arranging the at least one second type of conductive track portion according to a predefined layout;

locating the at least one second type of conductive track portion within the first type of conductive track portion; and coupling the at least one second type of conductive track portion with at least one detection circuit configured to detect an alteration of the at least one second type of conductive track portion;

wherein the material and the layout of the at least one second type of conductive track portion are formed so as to be visually indiscernible from the material and the layout of the at least one first type of conductive track portion.

11. The chip prepared by the process according to claim 10, wherein the at least one detection circuit enables the application of at least one countermeasure in response to detecting a physical or electrical alteration of the at least one second type of conductive track portion.

12. The chip prepared by the process according to claim 11, wherein the at least one countermeasure is one of resetting or disabling all or part of the functionality of the chip.

13. The chip prepared by the process according to claim 10, wherein the at least one second type of conductive track portion is located within the first type of conductive track portion forming a substantially planar power grid covering a top surface of the chip configured to supply the first type of conductive track portion with a potential which is substantially equal to a predetermined potential.

14. The chip prepared by the process according to claim 13, wherein the at least one second type of conductive track portion is configured to be supplied with a potential substantially equivalent to the potential of the first type of conductive track portion.

15. The chip prepared by the process according to claim 13, wherein the at least one second type of conductive track portion is placed in a way to be located within the first type of conductive track portion forming a shield against external electromagnetic perturbations or electromagnetic radiation produced by the integrated circuit chip activity.

16. The chip prepared by the process according to claim 10, wherein the at least one detection circuit comprises at least one transmitter configured to produce a test signal for applying to the at least one second type of conductive track portion and at least one receiver associated with the transmitter configured to verify integrity of the second type of conductive track portion by comparing the test signal with a reference test signal and configured to enable the at least one countermeasure if a result of the comparison shows a difference between the reference test signal and the test signal produced by the transmitter.

17. The chip prepared by the process according to claim 10, further comprising a set of fake and real detection circuits positioned at different places on the chip, the fake detection circuits being arranged according to a layout visibly indiscernible from the layout of the real detection circuit.

* * * * *

UNITED STATES PATENT AND TRADEMARK OFFICE
CERTIFICATE OF CORRECTION

PATENT NO. : 10,135,239 B2
APPLICATION NO. : 15/573615
DATED : November 20, 2018
INVENTOR(S) : Pascal Aubry et al.

It is certified that error appears in the above-identified patent and that said Letters Patent is hereby corrected as shown below:

In the Claims

In Column 7, Line 49, Claim 8, after "according" insert -- to --;

In Column 7, Line 56, Claim 8, delete "countermeasures" and insert -- countermeasure --; and In Column 7, Line 59, Claim 9, after "according" insert -- to --.

Signed and Sealed this
Twenty-eighth Day of April, 2020

Andrei Iancu
*Director of the United States Patent and Trademark Office*